(12) United States Patent
Thiagarajan et al.

(10) Patent No.: US 8,754,690 B2
(45) Date of Patent: Jun. 17, 2014

(54) PROGRAMMABLE DUTY CYCLE SETTER EMPLOYING TIME TO VOLTAGE DOMAIN REFERENCED PULSE CREATION

(71) Applicant: International Business Machines Corporation, Armonk, NY (US)

(72) Inventors: Pradeep Thiagarajan, Chapel Hill, NC (US); Anjali R. Malladi, Williston, VT (US)

(73) Assignee: International Business Machines Corporation, Armonk, NY (US)

( * ) Notice: Subject to any disclaimer, the term of this patent is extended or adjusted under 35 U.S.C. 154(b) by 48 days.

(21) Appl. No.: 13/661,062

(22) Filed: Oct. 26, 2012

(65) Prior Publication Data

US 2014/0118043 A1  May 1, 2014

(51) Int. Cl.
*H03K 3/017* (2006.01)
(52) U.S. Cl.
USPC .......................................... 327/172; 327/175
(58) Field of Classification Search
None
See application file for complete search history.

(56) References Cited

U.S. PATENT DOCUMENTS

| | | | |
|---|---|---|---|
| 4,736,118 A * | 4/1988 | Fischer | 327/175 |
| 5,757,218 A | 5/1998 | Blum | |
| 6,040,726 A | 3/2000 | Martin | |
| 6,078,203 A * | 6/2000 | Zafarana et al. | 327/174 |
| 6,426,660 B1 | 7/2002 | Ho et al. | |
| 6,501,313 B2 | 12/2002 | Boerstler et al. | |
| 6,518,809 B1 | 2/2003 | Kotra | |
| 6,583,657 B1 | 6/2003 | Eckhardt et al. | |
| 6,593,789 B2 | 7/2003 | Atallah et al. | |
| 6,603,337 B2 | 8/2003 | Cho | |
| 6,882,196 B2 | 4/2005 | Yee et al. | |
| 6,924,684 B1 | 8/2005 | Nguyen | |
| 6,981,185 B1 | 12/2005 | Davis et al. | |
| 6,992,516 B2 | 1/2006 | Yeh | |
| 7,019,574 B2 | 3/2006 | Schrodinger | |
| 7,126,397 B1 * | 10/2006 | Mok | 327/175 |
| 7,199,634 B2 | 4/2007 | Cho et al. | |
| 7,227,920 B2 | 6/2007 | Heikkila | |
| 7,471,133 B1 * | 12/2008 | Moussaoui et al. | 327/172 |
| 7,474,162 B2 * | 1/2009 | D'Abramo et al. | 331/111 |
| 7,839,192 B1 | 11/2010 | Wang | |
| 8,174,302 B2 * | 5/2012 | Fujiwara | 327/291 |
| 2002/0063591 A1 * | 5/2002 | Kinoshita et al. | 327/175 |
| 2009/0295445 A1 * | 12/2009 | Ouyang et al. | 327/172 |
| 2010/0007394 A1 * | 1/2010 | Hsueh et al. | 327/176 |
| 2010/0117699 A1 * | 5/2010 | Wu et al. | 327/172 |
| 2013/0278231 A1 * | 10/2013 | Kuo et al. | 323/234 |

OTHER PUBLICATIONS

DeLima, "A gm-C Ramp Generator for Voltage Feedforward control of DC-DC Switching Regulators", Circuits and Systems, ISCAS Jul. 2007 IEEE, pp. 1919-1922.

* cited by examiner

*Primary Examiner* — Tuan T Lam
(74) *Attorney, Agent, or Firm* — Scully, Scott, Murphy & Presser, P.C.; H. Daniel Schnurmann

(57) ABSTRACT

An improved programmable duty cycle generator and method of operation. In one aspect, the generated output signal duty cycle is not measured, but rather is generated based on a predetermined value. Saw tooth generator/Integrator schemes are used to create the saw type waveforms of the incoming frequency which in conjunction with DAC is used to create the desired duty cycle. The improved programmable duty cycle signal generator for placement in key pinch points of a critical path where precise duty cycle definition is needed.

25 Claims, 9 Drawing Sheets

PROGRAMMABLE DUTY CYCLE SETTER EMPLOYING TIME TO VOLTAGE DOMAIN REFERENCED PULSE CREATION

BACKGROUND

This disclosure relates to clock signal generators for electronic systems and circuits, and particularly, a duty cycle generator and method of operation for adjusting and setting duty cycle of a signal for timing operations with less jitter and increased accuracy.

Clocking signals used in most electronic systems provide the heart beat and pulse lines for correct operation. High speed applications such as SerDes (Serial/Deserializer) and DDR (double data rate) transmitter links sending data on both edges of a reference clock rely highly on its duty cycle. Duty cycle distortions in such applications impact timing margin and performance affecting eye closure.

Usually duty cycle distortions occur due to incoming clock duty cycle variations, systematic PFET vs. NFET process mismatch that affect threshold voltages, drive strength, etc, and local PFET vs. NFET device mismatch. They can also be altered by the processing circuit's architecture. For example, embedded PLLs (phase locked loops) used for clock generation could use LFSR (Linear Feedback Shift Register) divider architectures primarily chosen due to programmability and high speed operation. However the duty cycle (pulse duration) creation mechanics could not necessarily give a 50% output (which can vary based on the divide value chosen). Clock propagation circuits such as DLLs (Delay Locked loops), Delay lines, Phase Rotators, I/O drivers in-turn could cause additional static distortion (across process, voltage and temperature (PVT) ranges that the circuits are specified to run at) to the incoming variation, making the net outgoing static duty cycle variation worse.

BRIEF SUMMARY

It is an aspect of the present disclosure to provide an improved programmable duty cycle generator and method of operation.

The improved programmable duty cycle signal generator can be placed in key pinch points of the critical path where precise duty cycle definition is needed.

In one aspect, the duty cycle is not measured, but rather is generated based on a predetermined value. Saw tooth generator/Integrator schemes are used to create the saw type waveforms of the incoming frequency which in conjunction with DAC (Digital to Analog Converter) is used to create the desired duty cycle. The range of the output duty cycle is determined by the number of DAC control bits, for example if a 5 bit DAC is used, the output waveform can have any desired duty cycle from 3% to 97% in steps of about 3%.

According to an embodiment, there is provided a programmable duty cycle signal generator comprising: a first integrator circuit for receiving an input clock signal (CLK); the first integrator circuit creating from the input CLK signal a first linear voltage signal representative of a full time period of the input CLK; a digital to analog converter (DAC) receiving bits representing a programmed output signal duty cycle; a sampling circuit generating a voltage supply signal from the first linear voltage signal for input to the DAC, the DAC using the voltage supply signal and the programmed bits to generate a reference signal voltage representative of the programmed duty cycle; an edge pulse detector detecting an edge of the input CLK to create trigger signal and generating a rising edge of an output signal of the duty cycle signal generator; a second integrator for integrating, in real time, the output signal to create a second linear voltage output signal; a comparator device receiving the reference signal voltage and the second linear voltage output signal and generating a compared output signal at a time the second linear voltage output signal exceeds the reference signal, the compared output signal being used to generate a falling edge of the output signal, the output signal rising and falling edge occurring in each time period at the programmed duty cycle.

According to one embodiment, there is provided a method for programmable duty cycle signal generation comprising: integrating, using a first integrator circuit, the input CLK signal to create a first linear voltage signal representative of a full time period of the input CLK, and in each period: receiving at a digital to analog converter (DAC) bits representing a programmed output signal duty cycle; generating a voltage supply signal from the first linear voltage signal for input to the DAC; generating, by the DAC using the voltage supply signal and the duty cycle bits, a reference signal voltage representative of the programmed duty cycle; detecting an edge of the input CLK signal to create a rising edge of an output signal of the duty cycle signal generator output; integrating by a second integrator, in real time, the output signal to create a second linear voltage output signal; comparing, in real-time, the reference signal to the second linear voltage output signal; and, at a time the second linear voltage output signal exceeds the reference signal generating a compared output signal, generating, based on the compared output signal, a falling edge of the output signal in the current period of the output signal, the rising and falling edge of the output signal of the duty cycle signal generator timed according to the programmed duty cycle.

In an alternate embodiment, there is provided a programmable duty cycle signal generator comprising: a saw tooth conversion circuit for receiving an input clock signal (CLK) and creating from the input CLK signal a first linear increasing voltage signal representative of a full time period of the input CLK, and in each period: a digital to analog converter (DAC) receiving bits representing a programmed output signal duty cycle; a sampling circuit generating a voltage supply signal from the first linear increasing voltage signal for input to the DAC, the DAC using the voltage supply signal and the duty cycle bits to generate a reference signal voltage representative of a programmed duty cycle; an edge pulse detector detecting an edge of the input CLK to create trigger signal and generating a rising edge of an output signal of the duty cycle signal generator; a comparator device receiving the first linear increasing voltage signal and the reference signal voltage and for real-time comparing the first linear increasing voltage output signal to the reference signal, and, at a time the first linear increasing voltage output signal exceeds the reference signal, the comparator device generating a falling edge of the output signal in the current period of the output signal, wherein the rising and falling edges of the output signal of the duty cycle signal generator are timed according to the programmed duty cycle Further to this alternate embodiment, there is provided a method for programmable duty cycle signal generation comprising: receiving an input clock signal (CLK); converting, using a saw tooth converter circuit, the input CLK signal to create a linear rising voltage signal representative of a full time period of the input CLK; and in each period: receiving at a digital to analog converter (DAC) bits representing a programmed output signal duty cycle; generating a voltage supply signal from the linear increasing voltage signal for input to the DAC; generating, by the DAC using the voltage supply signal and duty cycle bits, a reference signal voltage representative of a programmed duty cycle; detecting an edge of the input CLK to create trigger signal and generating a rising edge of an output signal of the duty cycle signal generator; comparing, in real-time, the reference signal voltage to the linear increasing voltage signal, and, at a time the linear rising voltage signal exceeds the reference signal voltage, generating a falling edge of the output signal in the current period of the output signal, the rising and falling edge of the output signal of the duty cycle signal generator timed according to the programmed duty cycle.

In embodiments, the programmable duty cycle generator comprise interconnections of semiconductor structures and circuits, including CMOS or MOSFET structures.

Certain embodiments of the presented programmable duty cycle generator structure and operating method may comprise individual or combined features, method steps or aspects as mentioned above or below with respect to exemplary embodiments.

BRIEF DESCRIPTION OF THE DRAWINGS

In the following, embodiments of structures and methods relating to programmable duty cycle generation are described with reference to the enclosed drawings.

Like or functionally like elements in the drawings have been allotted the same reference characters, if not otherwise indicated.

DETAILED DESCRIPTION

Figure 1:
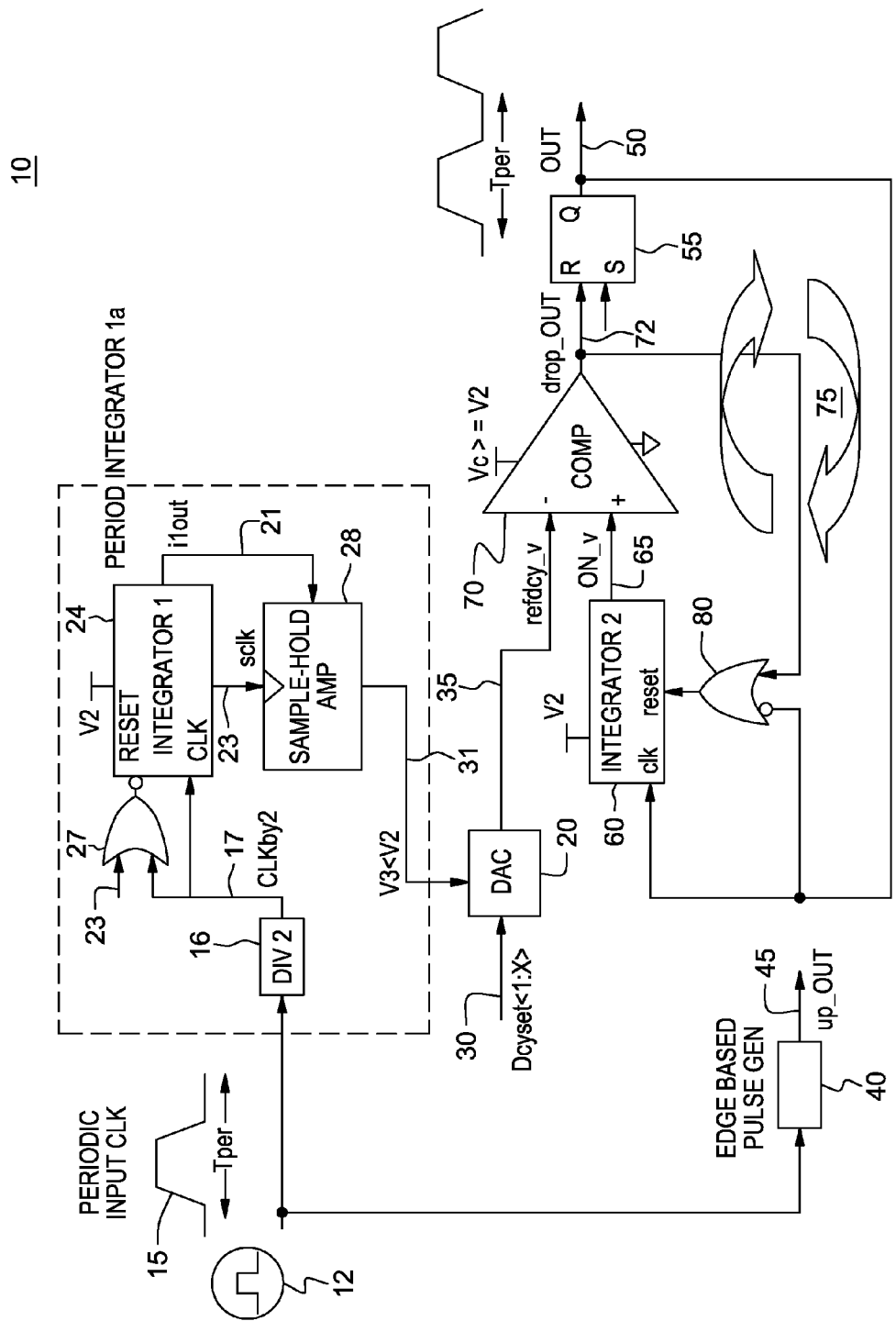
FIG. 1 shows a schematic diagram of an embodiment of a programmable duty cycle generator 10.

FIG. 1 shows a schematic diagram of an embodiment of a programmable duty cycle generator 10.

An electronic signal generator 12 provides a clock (CLK) signal 15 at a predetermined clock period $T_{per}$ (CLK period), to a periodic signal integrator circuit 25. In the generator 10, periodic signal integrator circuit 25 is of a divide-by-2 architecture such that its output signal ON time equals input CLK period, i.e., a 50% duty-cycle divider architecture for period. In an embodiment, periodic signal integrator 25 includes a first integrator element 24 (Integrator 1) implementing saw tooth generator/Integrator schemes to create the saw type waveforms of the incoming CLK frequency that, in conjunction with Sample-hold circuit 28, Digital-to-Analog Conversion circuit DAC 20 and other circuit elements forming a pulse-shaping system 75, is used to create an output signal 50 of a desired duty cycle.

In one embodiment, the input periodic CLK signal 15 is first converted by a divide-by-2 circuit 16 providing an output periodic CLKby2 signal 17 having an output ON time equal to CLK time period $T_{per}$. That is, the provided divider output periodic CLKby2 signal ON time duration plus its OFF time duration is equal to 2×CLK's Tper. This CLKby2 signal 17 is integrated in the voltage domain by first integrator element 24 to provide a linearly rising voltage signal i1out for the time length of Tper. This integration is done each CLK cycle for real time tracking of input CLK period. Use of NOR gate reset element 27 ensures that the integration always starts from ground reference for each successive time period. The maximum voltage of the linearly rising voltage signal, i1out, is sampled and held to generate a reference voltage V3. Successive time periods can be isolated by the use of divide-by-2 circuit 16. In one embodiment, the Divide-by-2 architecture need not have a dependency that its output ON time equals CLK period. The ON and OFF times of divider output are "averaged" in voltage domain to provide a reference for Tper.

Figure 3:
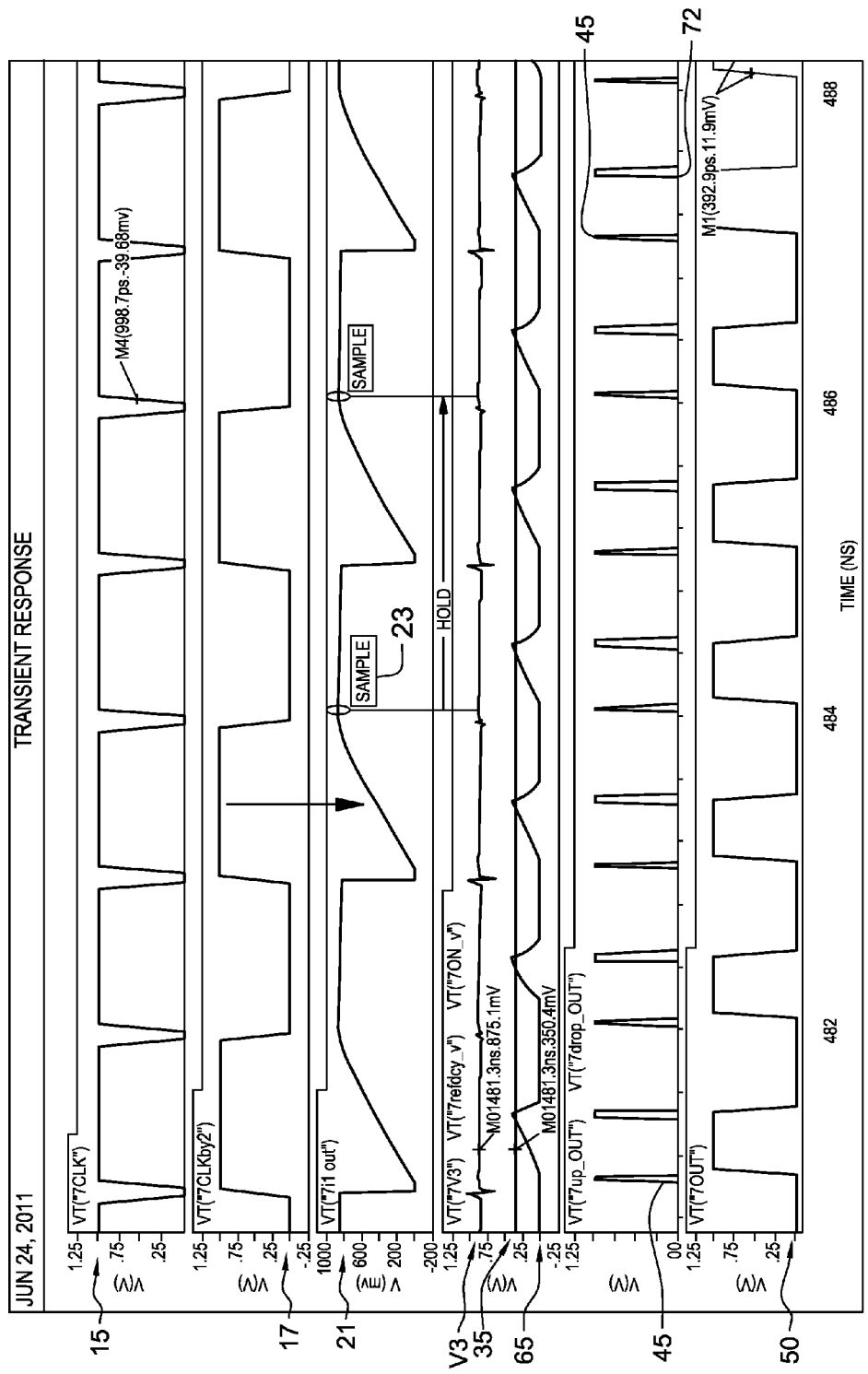
FIG. 3 shows a timing diagram depicting the waveforms produced by the programmable duty cycle generator circuitry.

As shown in FIG. 3, in this embodiment, the divide-by-2 circuit 16 provides "50% duty cycle" signal 17 as a way of tracking each period of input CLK—the divider's output ON time will now correspond to a full time period of CLK, and so does its OFF time. This CLK frequency is used as the ON and/or OFF time pulse to trigger the integration. Hence it operates as a time tracker to demarcate when a full time period has gone by, and when a next time period begins, etc.

Alternatively, any mechanism that can detect rising edges (or falling edges) of CLK may be used to trigger integration from this rising (or falling) edge to the next rising (or falling) edge before resetting the integrator, may be used. Hence, the Integrator circuit 24 (and other integrator circuits/saw tooth converter circuits described with respect to FIGS. 1, 2 and 7) are able to function off edge detections (instead of pulse ON or OFF times that the div2 element provides). Such a front end mechanism can be implemented in many ways using digital gates as long as they enable the integrator 24 to integrate from one edge to the next before resetting.

Figure 2:
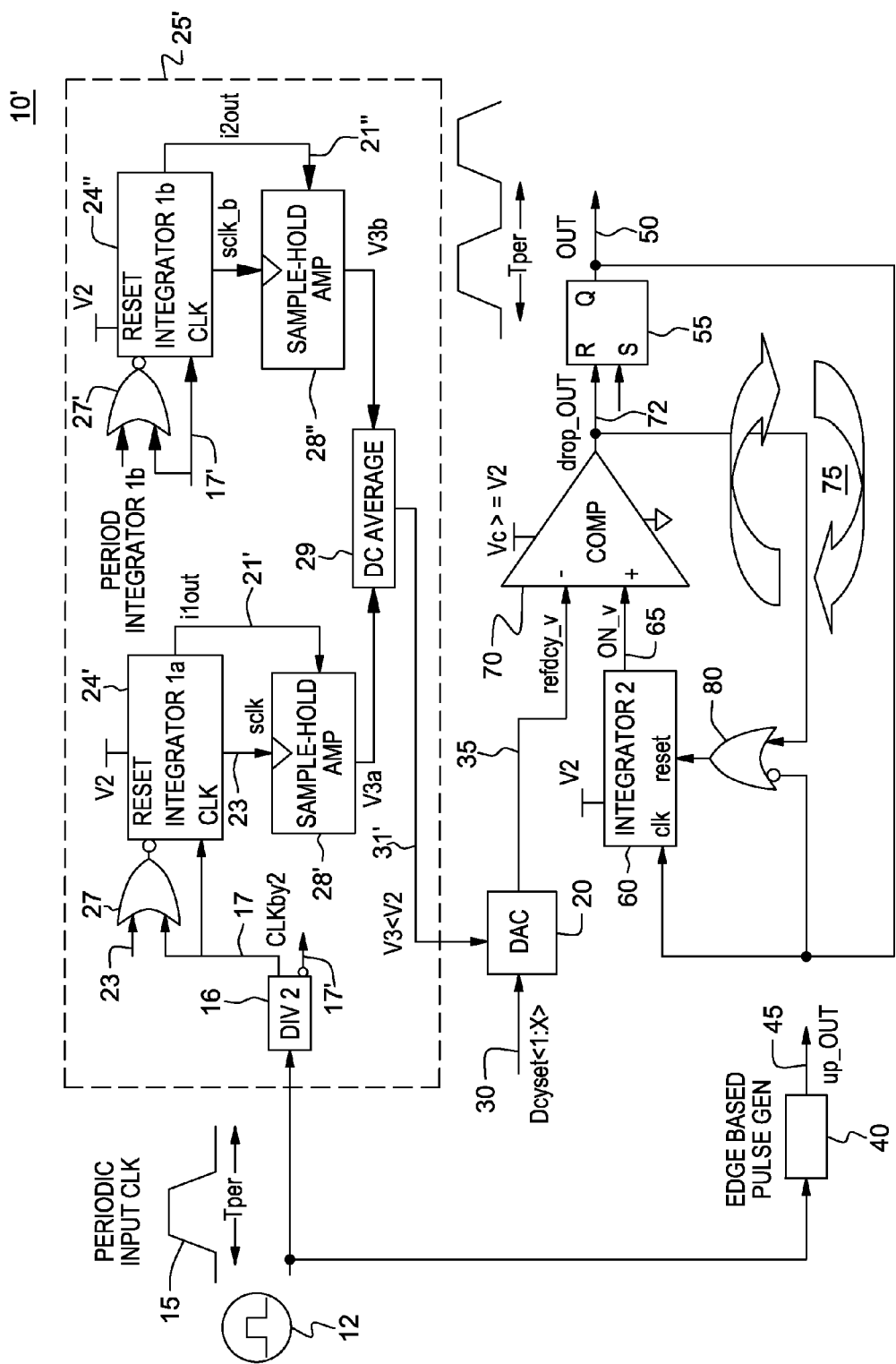
FIG. 2 shows a schematic diagram of an alternate embodiment of a programmable duty cycle generator 10.

As further shown in FIG. 1, the CLKby2 17 besides being provided to a clock signal input of first integrator 24 (Integrator 1) for Integrator 1 integration (or time to voltage conversion). CLKby2 signal 17 is additionally received as one input at a logic gate, e.g., a NOR gate logic circuit element 27, providing an output reset signal to a reset input at Integrator 1 for resetting integration operations to the ground reference at each cycle. In other words, when CLKby2 is high (ON time), the integrator is in integration mode (or non-reset mode). When CLKby2 is low (OFF time), the integrator is in reset mode after sampling is done and before the next rising edge of CLKby2. Other circuits besides the NOR circuit may be configured to receive the CLKby2 signal for reset functionality every period. For an Integrator reset, NOR circuit element 27 further receives a "sclk" signal 23 relating to the time base for sample-hold operations of the Integrator 1 output i1out signal 21 as will be described. That is, as shown in FIGS. 1, 2 and 3, the arrival of the falling edge of CLKby2 signal 17 signals that the "i1out" signal 21 has finished integrating and that its voltage can now be sampled. Hence "sclk" is a sample signal 23 that may be a falling edge based pulse that can be used to sample the voltage of i1out signal 21 at sample and hold circuit. The sclk signal is hence used to give the consent to resetting the integrator after a delay equal or more than the time it takes the sample-hold 28 to sample.

Furthermore, Integrator 1 receives an input supply voltage V2, CLKby2 and reset input signals and generates i1out signal (e.g., a signal waveform having a saw rise profile) after every rising edge of CLKby2 for the duration of its ON time each cycle. Output signal i1out is received as input to sample and hold (Sample-hold) amplifier circuit 28. Sample-hold circuit 28 further receives the sampling clock signal sclk 23 generated from the clk used at Integrator 1 providing time base for Sample-Hold circuit sampling operations.

The Integrator 1's charge-up slope is fixed irrespective of frequency change. Thus the maximum voltage V3 at the end of each $T_{per}$ is unique (e.g., V3(f)) for a given CLK frequency (f=frequency). Integrator 1 is implemented using Resistive-Capacitive elements (RC) and provides gain such that its output voltage (V3) roof for a chosen CLK frequency range is less than its supply voltage (i.e., V3<V2).

The V3 output (of the S-H circuit) is used as the power supply input to the DAC 20. For any given Tper, the integrator charges from 0 v to Vper volts. Then Vper gets sampled as V3 at the arrival of sclk. Vper can be different for a different frequency and PVT. The V3 is a supply reference input to the DAC 20. Thus, referring to the above timing of the waveforms shown in FIG. 3, V3 is the sampled i1out signal 21, i.e., V3's voltage value is equal to i1out's voltage value at the sample point.

The DAC 20 translates user-programmed duty cycle bits 30, i.e., bits Dcyset<1:x>, to create another reference voltage 35 which is a measure of a required duty cycle or refdcy_v. The output duty cycle can be programmed in steps of $(½^x)·Tper$. For example if a 6 bit DAC is used, the output duty cycle can be adjusted in 64 steps starting with 1.56% to 178.4% in steps of 1.56%.

In generator 10, sample-hold circuit 28 samples V3 before the falling edge of i1out. This ensures the maximum voltage is sampled at the end of the integration duration. In one embodiment, this is performed using an operational amplifier (Op-amp) based structure (not shown) that uses the sampled V3 as reference and provides output voltage (also V3) but with sufficient current drive. This V3 signal is used as the supply (V3) for the DAC 20 with linear characteristics matching the integrator slope. So V3 is a voltage domain measure of time period of input CLK.

The sampling signal sclk is a pulse of certain duration dependent on a minimum time needed to perform a sample operation by the Sample-Hold circuit. It is generated after the integration duration time is complete. It can be triggered and generated off the falling edge of the signal being integrated.

The DAC (Digital to Analog converter) 20 performs converting digital bits 30 to an analog voltage 35 providing a reference voltage significant of required output duty cycle— that portion (time) of $T_{per}$ that needs to be ON. The structure of DAC is as generally known in the art and different architectures are contemplated.

Programmable resistor dividers are used as the DAC in one example architecture. The number of digital states that can be created from bits Dcyset[1:x] 30 are first identified, which then translate to a unique reference voltage (refdcy_v) signal 35 between 0 and V3 volts that represents the indirect measure of required duty cycle to be achieved. The more the DAC's linearity matches the Integrators' linearity across PVT, the more accurate the output duty cycle (signal 50) will be with respect to the required duty cycle needed.

In generator 10 of FIG. 1, a closed-loop pulse shaper 75 creates an output pulse 50 with the correct (programmed) duty cycle. This is accomplished using a pulse rising transition pulse 45 triggered off any one chosen edge of incoming CLK 15. In one embodiment, output pulse 50 generation is accomplished with the set function of an SR latch. As shown, an edge-based pulse generator circuit 40 receives CLK input clock 15 providing up_OUT pulse 45 (output rising transition based on an CLK signal edge). This output rising transition pulse 45 is provided as input to a set function of an SR latch 55 generating output pulse 50. Integrator 2 60 performs an integration of this pulse 50 after its output rising transition is started. The Integrator 2 60 is configured to have the same rising slope characteristics as the Integrator 1 (i.e., Integrator 1 and 2 of FIG. 1 are matched with respect to RC time constants to have matching rise slopes and reduce mismatch of time period to voltage (t→v) conversion.

Comparator device 70 performs a real-time comparison of the output 65 of the second integrator 60 with the analog reference refdcy_v 35. Once the output value equals or exceeds refdcy_v, the falling edge of the same output pulse 50 is forced. This is affected as drop_OUT signal 72 of comparator 70. Thus falling edge of output pulse 50 is accomplished with the reset function of the SR latch 55 receiving drop_OUT signal 72. The integrator 60 is also reset to ground reference in the mean time, e.g., via OR circuit element 80, before the arrival of the next cycle of OUT's rising transition 45. The OUT signal 50 then has the required duty cycle.

More particularly, in view of the signal timing diagram of FIG. 3, the ON_v signal 65 is of a saw like profile is input to the (on +' ive terminal of comparator 70) while signal wave is refdcy_v signal 35. When ON_v signal 65 exceeds refdcy_v signal 35 (on −'ive terminal of comparator 70), the comparator will create the rising drop_OUT signal 72 which will trigger a reset of the SR latch 55, hence creating the falling transition of OUT signal 50. The 0→1 rising drop_OUT signal is additionally input to the OR gate 80, making its output a logic "1", hence initiating the reset function of the integrator2 60 and forcing the integrator2's output (which is ON_v) start to decay. Once it goes below the refdcy_v value, the drop_OUT signal created by comparator will be a falling transition from 1→0. Hence the delay of the elements from the above reaction determines the pulse width of drop_OUT signal.

It is understood that the reset signal of integrator2 element 60 is to be completely asserted until the next rising edge of CLK (edge converted as the signal UP_out 45).

Thus, the 1→0 transition of the OUT signal 50 now also is input to the OR gate 80 at the inverter terminal input, hence forcing the OR gate output to be 1. This keeps integrator2 in reset mode, even after the other input (drop_OUT 72) of the OR gate goes low. Thus integrator2 will stay in reset mode until the set ("S") input of SR latch 55 gets asserted by UP_out 45.

In an example implementation, an incoming CLK frequency (CLK) is equal to 1 GHz, with a dutycycle (On vs. off time) of 90%. With signal refdcy_v 35 being 0.35 v and signal V3 being 0.875 v, the output duty cycle of signal 50 is 0.35 v/0.875 v=0.4 (representing a required 40% duty cycle). Output duty cycle of the 50 of the programmable duty cycle generator 10 in the example was about 40% as shown in the timing diagram of the various waveforms as shown in FIG. 3.

FIG. 2 shows a schematic diagram of an alternate embodiment of a programmable duty cycle generator 10'. Like elements shown in FIG. 2 correspond to those of FIG. 1. In one respect generator 10' replaces the periodic signal integrator 25 of FIG. 1 with periodic signal integrator 25' including a first integrator element 24' (Integrator 1A) and second integrator element 24". The first integrator element 24' (Integrator 1A) functions identically as the first integrator element 24 (Integrator 1) of FIG. 1. It is preferred that Integrator 1A, 1B, and 2 of FIG. 2 are matched with respect to RC time constants to have matching rise slopes and reduce mismatch of input CLK period time to voltage (t→v) conversion. In the embodiment of FIG. 2, programmable duty cycle generator 10' implements an averaging technique: The Div-by-2 architecture with 50% dutycycle output as shown in FIG. 1 is not necessary as, in this generator embodiment, the divider circuit output's ON duration time is not necessarily equal to CLK's Tper, and similarly, the divider circuit output's OFF duration is not necessarily equal to CLK's Tper. In this embodiment, the two signals (divider circuit output's ON time and OFF time) are averaged to represent the full Tper. Hence the V3a voltage (voltage representation of divider output's ON time) and V3b (voltage representation of divider output's OFF time) are averaged.

Thus, while the divider circuit 16 is shown in FIG. 2 as a divide by 2 component, it does not necessarily require a div-by-2 device. However, the divider circuit 16 is shown in FIG. 2 as further generating a complement CLKby2 signal 17' (the complement of the CLKby2 signal 17) that is provided to a clock signal input of second integrator (Integrator 1B) 24" for clock signal integration thereof CLKby2 signal 17' is additionally received as one input at an NOR circuit element 27' providing an output reset signal to a reset input at Integrator 1B for resetting integration operations to the ground reference at each cycle (period). In other words, when CLKby2 is high (ON time), the Integrator 1A is in integration mode (or non-reset mode) while the Integrator 1B is in reset mode after sampling is done and before the next rising edge of the complement of CLKby2 signal 17'. When CLKby2 is low (OFF time), the Integrator 1A is in reset mode after sampling is done and before the next rising edge of CLKby2 while the Integrator1B is in integration mode (or non-reset mode). The NOR circuit may include a variety of other circuit elements and configurations as known in the art. The NOR circuit element 27' further receives the sclk_b signal for resetting the Integrator 1B.

Integrator 1B particularly receives an input supply voltage V2, CLKby2 signal 17' and reset input signals and generates i2out signal (e.g., a signal waveform having a saw rise profile) after every rising edge of CLKby2 for the duration of its ON time each cycle. Respective output signals i1out (generated by Integrator 1A) and i2out (generated by Integrator 1B) are received substantially simultaneously at respective sample and hold (Sample-hold) amplifier circuits 28' and 28". Each sample-hold circuit further receives a sampling clock signal, sclk, generated from the clk at the Integrators 1A, 1B providing timing control for sampling operations as described with respect to Sample and Hold operations of the generator 10 of FIG. 1. Thus, in this embodiment, a sampling of i1out occurs after the falling edge or CLKby2; hence sclk is a falling edge triggered pulse; and, a sampling of i2out occurs after the rising of CLKby2, hence sclk_b is a rising edge triggered pulse. The sclk (and sclk_b) signals are hence used to give the consent to resetting the integrators 1A (and 1B) respectively after a delay equal or more than the time it takes the sample-hold 28' (and 28") to sample.

In the embodiment of FIG. 2, each Integrator 1A and Integrator 1B generates a respective voltage domain measure V3A, V3B—voltage domain measure V3A being the ON time of the divider (divideby2) clock output (input of Integrator 1A) and voltage domain measure V3B being the OFF times of the divider (divideby2) clock output (input of Integrator 1B). An averaging circuit element 29 receives both V3A, V3B and generates from the V3A and V3B voltage measures an average V3 signal 31' that is used to supply the DAC 20. In one embodiment, the averager 29 is a DC averaging circuit to bring out the common mode value. One example is a form such as:
V3A connected to Resistor R1 (not shown) connected to V3 connected to Resistor R1 connected to V3B.

Figure 4:
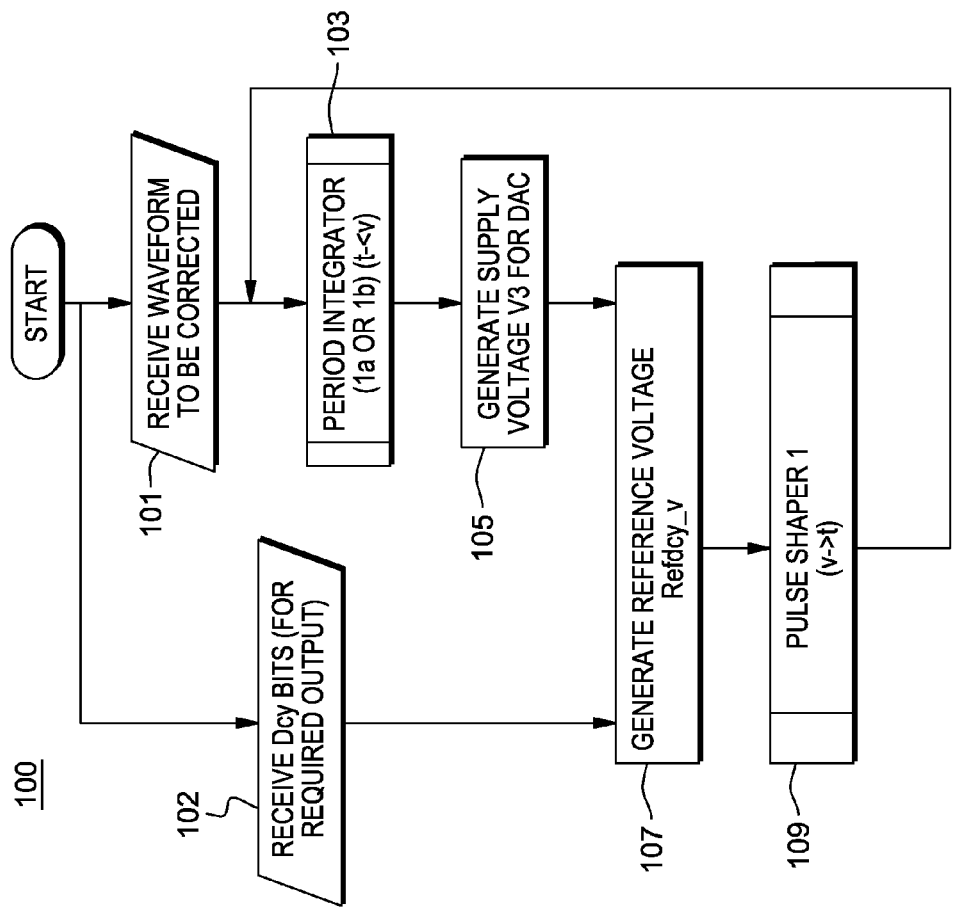
FIG. 4 is a flow chart depicting a method 100 performed by the duty cycle generator 10 of FIGS. 1 and 10' of FIG. 2.

FIG. 4 is a flow chart depicting a method 100 performed by the duty cycle generator 10 of FIG. 1 and the duty cycle generator 10' of FIG. 2.

As shown in FIG. 4, method 100 includes at 101 receiving at the integrator circuit the clock waveform (or desired periodic electronic signal) to be duty cycle corrected. In the embodiment depicted in FIG. 1 and timing diagram of FIG. 3, this represents clock waveform 15 being received at the divider such that the divided clock waveform 17 is provided at the clk input of the period integrator 25 of the generator 10 for integration measurement. Concurrently in time or simultaneously, at 102, the desired waveforms duty cycle setting as represented as Dcyset<1:X> bits 30 are input to the DAC circuit 20 of the generator 10. Continuing at 103, the Integrator 1 device 24 performs an integration of the divided input clk signal as described in greater detail herein with respect to the method 250 of FIG. 5. Integrator 1 outputs a signal i1out 21 as shown in FIGS. 1 and 3. This i1out is provided to the input of the sample and hold circuit 28. In the alternative embodiment on FIG. 2, Integrator 1a outputs a signal i1out 21' and Integrator 1b outputs a signal i2out 21" as shown in FIGS. 2 and 3. This i1out 21' and is i2out 21" are provided to the input of the sample and hold circuits 28' and 28" respectively. At 105, the output of Sample and hold circuit provides the V3 voltage supply level (this would be a dc average for the alternate embodiment shown in FIG. 2) to be input to the DAC 20 as shown in the generator 10. In FIG. 2, at 107, based on the desired duty cycle bit setting 30 and the V3 voltage at DAC input, the DAC performs the digital to analog conversion of the V3 signal to obtain the reference voltage of the required duty cycle measure refdcy_v voltage 35. This DAC processing is performed at 107 in FIG. 2 and waveforms shown in FIG. 4. In this manner, there is obtained the voltage domain measures of the ON and OFF times of divider output (t→v). The average, V3 signal 31 is used to supply the DAC 20. Finally, at 109, pulse shaper circuit elements forming a close loop system 75 using second integrator 60 and comparator 70 provides the desired output (clock) waveform 50 as shown in FIGS. 1 and 3. Generator circuit 10 of FIG. 1 employs a pulse shaper methodology 300 described herein with respect to FIG. 6.

Figure 5:
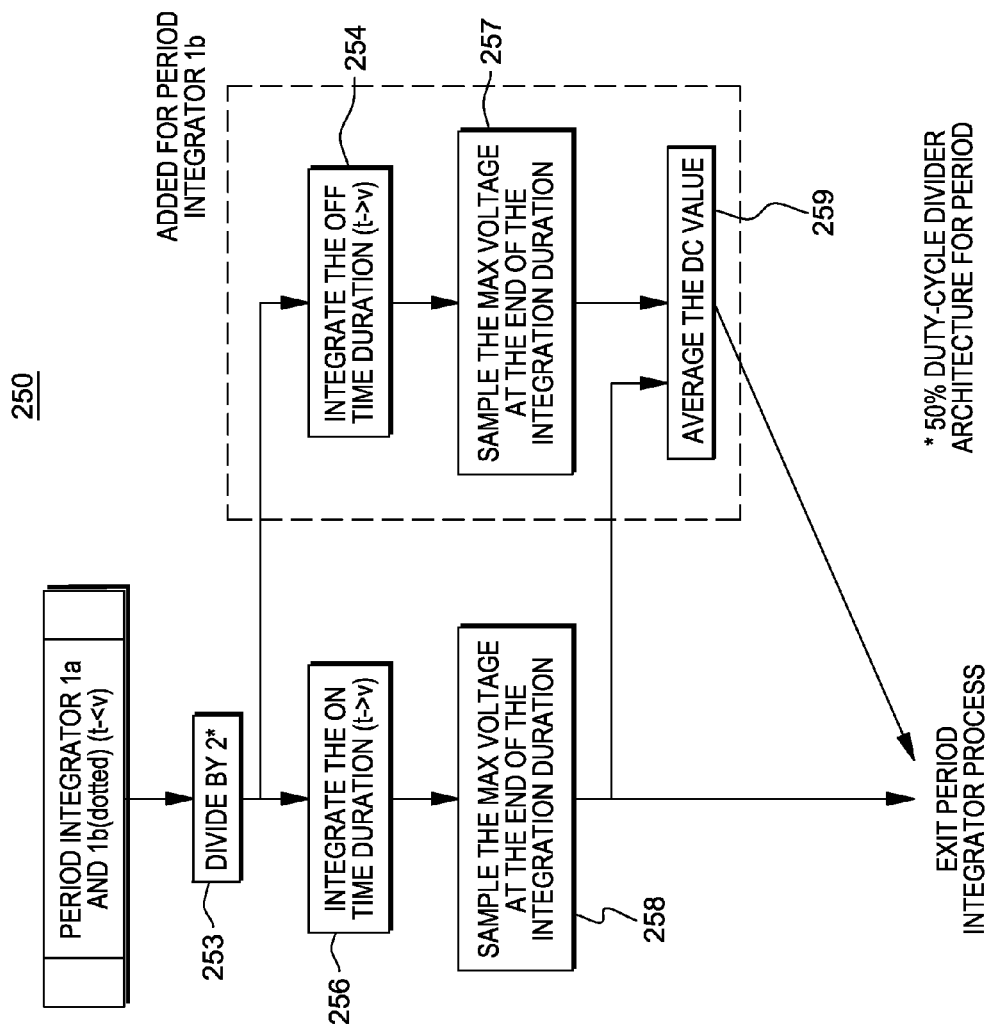
FIG. 5 shows a flow chart detailing method 250 of operating the period integrator circuits 25 and 25' of FIGS. 1 and 2.

FIG. 5 shows a flow chart detailing method 250 of operating the periodic integrator circuits 25 and 25' of FIGS. 1 and 2. At 253, clock signal of an original duty cycle is input to divide by 2 circuit which changes the frequency of the clock for input to an Integrator 1 in the embodiment of FIG. 1 (Integrator 1A and 1B in the embodiment of FIG. 2). At 256, the integrator performs an integration of the ON time duration, representative as a transformation of the clk on-time period to a voltage (i.e., t→v). Then at 258, FIG. 5, the maximum voltage is sampled at the end of the integration duration and the periodic integration process ends.

With respect to the implementation of Integrators 1A and 1B in embodiment of FIG. 2, FIG. 5 shows a simultaneous parallel integration process performed where Integrator 1A performs steps 253, 256 and 258 using CLKby2 signal 17 and simultaneously Integrator 1B performs identical steps 254, 257 and 259 using complement CLKby2 signal 17' to provide the DC average value V3 signal 31'.

Figure 6:
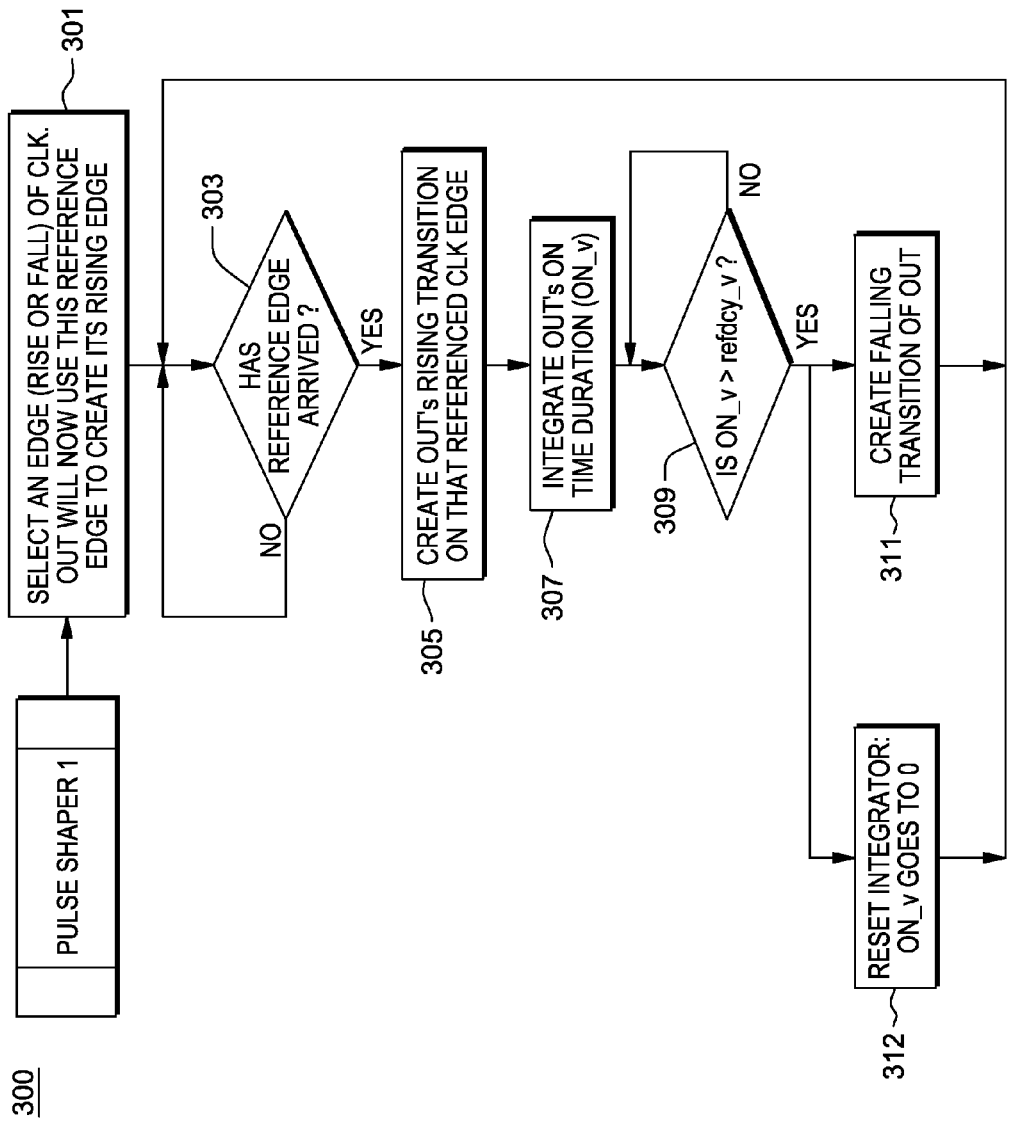
FIG. 6 shows pulse shaper methodology 300 performed by elements forming closed-loop pulse-shaping system 75 of FIGS. 1 and 2.

FIG. 6 shows pulse shaper methodology 300 performed by elements forming closed-loop output pulse shaping system 75 of FIGS. 1 and 2. First there is performed selecting an edge (rise or fall) of CLK and using this reference edge to create a rising edge signal of output signal OUT. The OUT's rising transition generated on that referenced CLK edge triggers the Integrator 2 to integrate OUT signal at 307. An iterative process is initiated at 303 including first the arrival of the CLK reference edge to trigger the SR latch element and at the same time the rising edge transition to trigger the integration of the OUT's ON time duration, i.e., ON_v output of Integrator 2. Then, a determination is made at 309 as to whether the ON_v signal (On) time becomes greater than the measure of the DAC output, i.e., whether ON_v>refdcy_v. As shown, the integrator 2 integrates at 309 until the instant Integrator 2 output (measure of the output duty cycle) becomes greater than the programmed refdcy_v reference level. At such time the Integrator 2 output (measure of the output duty cycle) is greater than the refdcy_v level, a falling transition of the generator OUT signal 50 is created and drop_out signal 72 is created. Simultaneously, at 311, the Integrator 2 is reset using drop_out signal 72 and a logic element 80, e.g., a NOR gate or like equivalent. The Integrator 2 output signal ON_v 65 goes to 0. Then, the process returns to step 303 which depicts the detecting the selected edge of the CLK signal of the next period from which the generator output clock ON time is measured.

In sum, there is "integrated" the entire CLK input signal period by the "period integrator" blocks (which repeats every cycle) from a minimum ("min") to a maximum ("max") value. Thus, a linear min to max value in voltage is generated equivalent to a full time period of CLKIN. In one embodiment, a div2 circuit approach is used with a 50% duty cycle architecture (its ON time is equal to its OFF time) where the divider's circuit output signal ON time represents a full CLK time period. That duration is linearized by integration like a sawtooth's linear rise. The linear DAC generates a reference voltage (signifying required duty cycle based on the user-programmed input bits) that lies between the min and max value of the linear rise signal. The created closed loop 75 implementing a comparator is such that generator output signal OUT's rising edge happens at the time of the "min" voltage is generated. The same OUT signal is integrated real-time. The comparator forces a falling edge at a time when the saw tooth's rise voltage equals the reference voltage (measure of desired duty cycle on time per period) and additionally resets the Integrator 2, i.e., the positive terminal of comparator 70 constantly ramps and resets every cycle.

Figure 7:
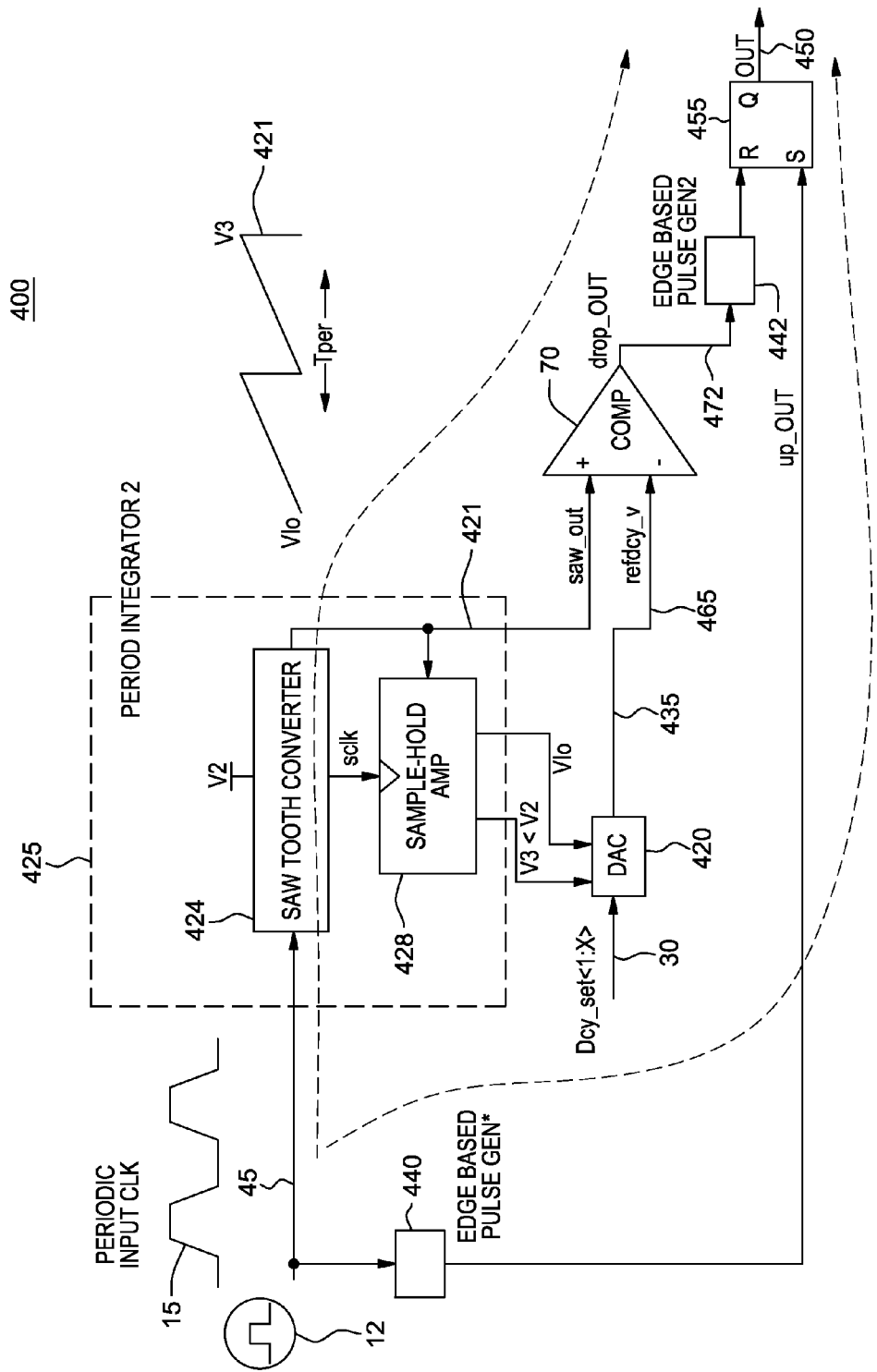
FIG. 7 shows a programmable duty cycle generator 400 of a further embodiment.

FIG. 7 illustrates an alternate embodiment of a programmable duty cycle generator 400 with like elements indicated as in the generator 10 of FIG. 1. In the programmable duty cycle generator 400, the integrator element 425 includes a saw tooth converter element 424 in place of Divider2 and Integrator 1 elements of the prior embodiments. In circuit 400 of FIG. 7, the generator is feed forward based (unlike feedback based in the prior embodiments), i.e., the method and circuit structure includes a feed forward based correction pertaining to a voltage reference output pulse creation with respect to incoming time period using a feed forward path for pulse shaping.

In circuit 400 of FIG. 7, the saw-tooth converter element 424 is a Sine or Square to Saw tooth converter 424 employed to convert the incoming clock signal to a conventional saw wave with linear rise and negligible fall. Hence, the time period of incoming clock signal is equivalent to the Saw output's rising time. A DAC (as in the prior embodiments) is configured to be supply driven of the maximum Saw voltage: either by sampling or direct set (if known based on saw converter's architecture). User programmed duty-cycle bits are converted by the DAC (as in the prior embodiments) to now provide a reference duty-cycle voltage (refdcy_v) that is a linear function of its supply.

The feed forward mechanics is such that the CLK edge creates an output pulse rising transition as well as it triggers the saw converter's rising transition. This may be accomplished with the set function of an SR latch 455. The sawtooth converter output is forwarded and compared to the refdcy_v. Once the saw-tooth converter output value equals or exceeds refdcy_v, the falling edge of the same output pulse is forced. This can typically be accomplished with the reset function of the SR latch 455. The OUT signal 450 then will have the required duty cycle.

More particularly, FIG. 7 shows the generated Saw tooth waveform saw-out signal 421 which is linear and has a negligible fall delay. The saw-out signal's output slope is constant irrespective of input frequency changes. So maximum output voltage at the end of Tper is, for example, V3 (V3<V2), where V2 is the supply of the Saw converter. So V3 is a voltage domain measure of time period of the input CLK.

This V3 voltage is sampled just before the falling edge of Saw_out. This can be performed using operation amplifier sample-hold techniques that uses the sampled V3 as vref and provides output voltage also V3 but with sufficient current drive. This is used to generate the supply for a DAC with linear characteristics matching the saw converter slope. So V3 is a voltage domain measure of CLK (input) time period.

The sampling "sclk" signal is a pulse of certain duration dependent on minimum time needed to sample by the Sample-Hold circuit. It is generated after the saw output reaches maximum voltage and before the saw falling transition occurs. It can be triggered and generated off a time advanced version of the saw-falling edge.

The DAC (Digital to Analog converter) element 420 that converts digital bits to an analog voltage is used to provide reference voltage significant of required output dutycycle— that portion of Tper that needs to be ON time. The structure of DAC may comprise any well-known architecture, e.g., programmable resistor dividers. The number of digital states that can be created from bits Dcyset[1:x] are first identified, which then translate to a unique reference voltage (refdcy_v) between 0 and DAC's supply that represents the indirect measure of required duty cycle to be achieved.

Figure 8:
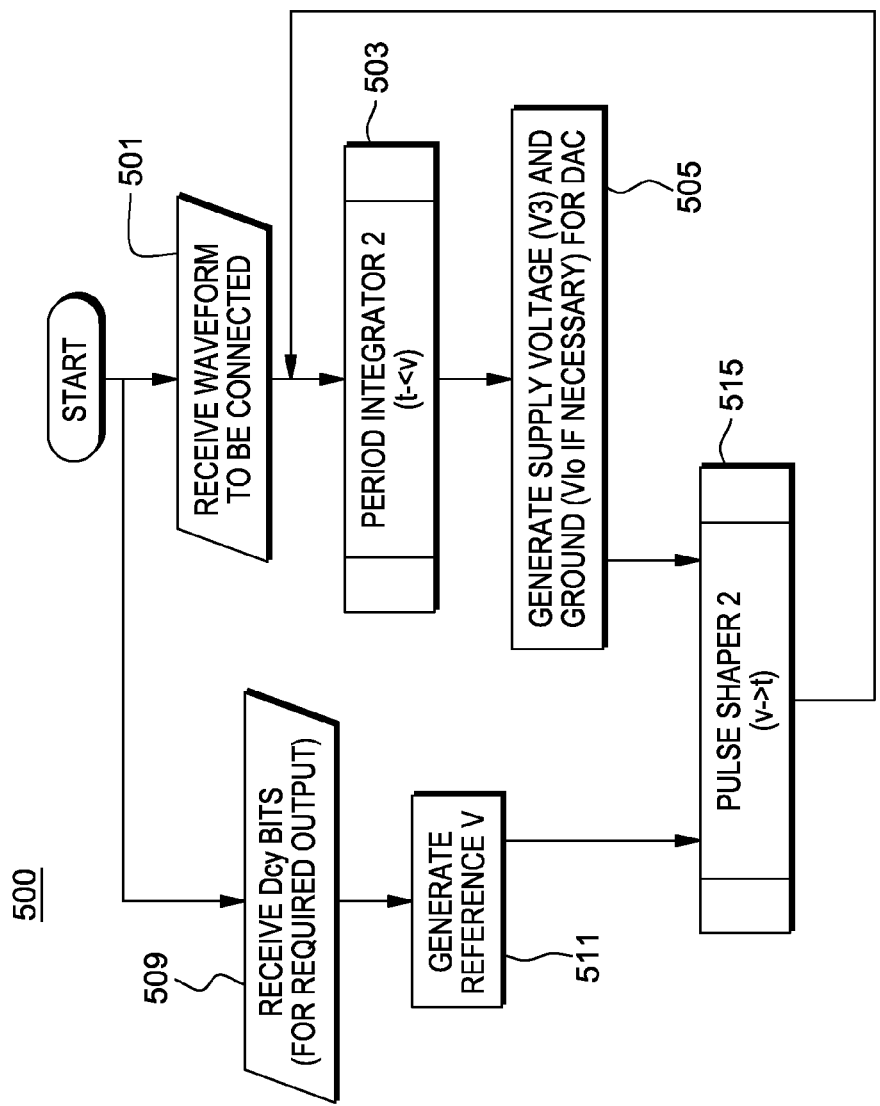
FIG. 8 illustrates is a flow chart depicting a method 500 performed by the duty cycle generator 400 of FIG. 7.

FIG. 8 illustrates is a flow chart depicting a method 500 performed by the duty cycle generator 400 of FIG. 7.

As shown in FIG. 8, method 500 includes at 501 receiving the input clock waveform CLK at the sawtooth converter circuit (or desired periodic electronic signal) to be duty cycle corrected as in the embodiments depicted in FIGS. 1 and 2. Continuing at 503, the Sawtooth converter device 424 performs a conversion of the input CLK signal. Sawtooth converter outputs a signal 421 as shown in FIG. 7 which is provided to the input of the sample and hold circuit 428. At 505, the output of sample and hold circuit 428 provides the V3 voltage supply level to be input to the DAC 420 as shown in the generator 400. Additionally, if needed, a ground signal "Vlo" is generated for the DAC.

That is, as the lowest voltage from where the sawtooth output 421 rises each cycle, that voltage should be the same as the ground potential of the DAC 420 to ensure that DAC voltage scale matches the Saw converter's min to max voltage scale. If the Saw converter architecture is such that the min voltage is different (e.g., Vlo), then the low point also needs to be sampled as the ground reference of the DAC.

Concurrently in time, or simultaneously, at 509, the desired waveforms duty cycle setting as represented as Dcyset<1:X> bits 30 are input to the DAC circuit 420 of the generator 400.

From received bits 30, and the V3 voltage at DAC input, the DAC circuit 420 performs the digital to analog conversion of the V3 signal to generate a reference voltage 435 representative of the desired output duty cycle setting as indicated at 511.

Then at 515, feed forward pulse shaping is performed based on the received reference voltage 435 representative of the desired output duty cycle from 511, and the Sawtooth waveform 421 voltage level. The employing of pulse shaper methodology 600 is now described herein with respect to FIG. 10.

Figure 9:
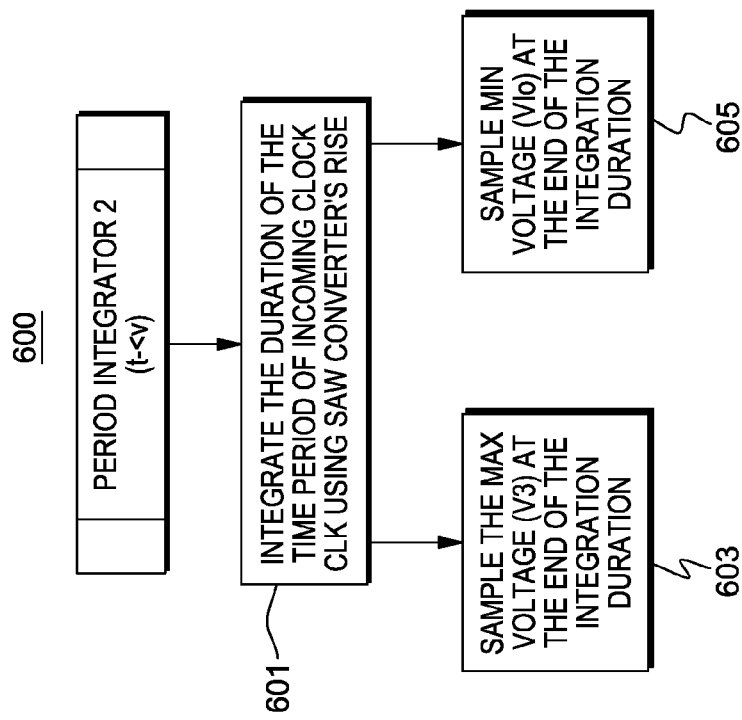
FIG. 9 shows saw-tooth conversion methodology 600 employed by the duty cycle generator of FIG. 7 for generating the Sawtooth waveform representative of input CLK frequency.

FIG. 9 shows saw-tooth conversion methodology 600 employed by the period integrator2 425 of FIG. 7 for generating the Sawtooth waveform representative of input CLK frequency. At 601, the sawtooth generator performs an integration of the time period of the input clock using the saw converter's rise. Then at 603 the max voltage (V3) is generated by sampling the sawtooth waveform at the end of the integration duration. Further, at 605, the minimum or ground reference voltage Vlo is generated by sampling at the end of integration.

Figure 10:
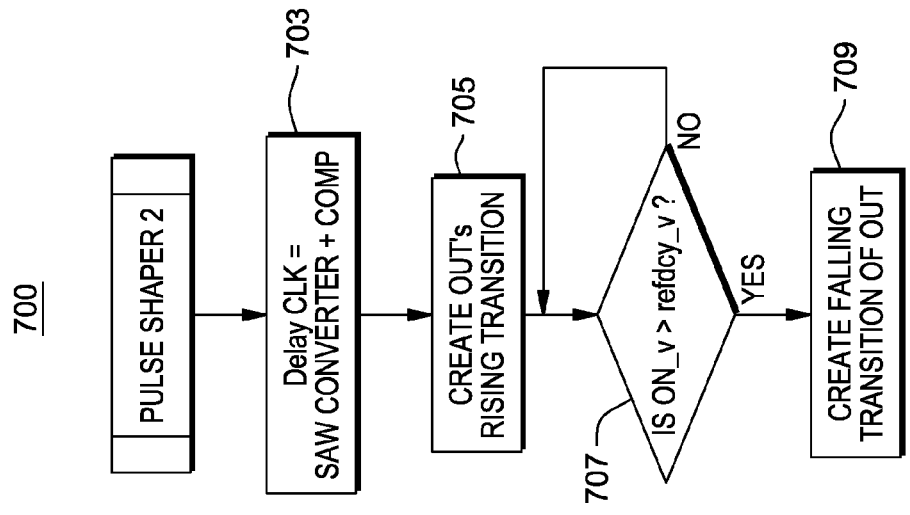
FIG. 10 shows pulse shaper methodology 700 performed by programmable duty cycle generator 400 of a further embodiment.

FIG. 10 shows pulse shaper methodology 700 performed by programmable duty cycle generator 400 of FIG. 7. At 703, first the delay of the first edge based pulse generator 440 providing up_OUT signal which triggers the latch to form the output signal rising edge and is adjusted or matched to equal or match the delay engendered by the feed forward processing performed by the comparator, the Sawtooth generator, and a second edge based pulse generator element 442. This may entail first selecting an edge (rise or fall) of input CLK and using this reference edge to create a rising edge signal by edge pulse generator circuit 440. The referenced input CLK edge triggers the SR latch element 455 such that output signal 450 of the programmable duty cycle generator (i.e., OUT) has a rising transition generated on that SR latch edge trigger to form the OUT's signal ON time duration as indicated at 705. Meanwhile, at 707, a determination is made as to whether the rising saw_out signal 421's voltage becomes greater than the reference voltage output from the DAC output, i.e., whether saw_out>refdcy_v. That is, the comparator 460 performs real-time comparing of the saw_out signal 421 with the refdcy_v signal 435, and when the saw_out signal 421 exceeds the refdcy_v, the falling edge of the same output pulse 450 is forced as indicated at 709 as comparator drop_out signal 472 is generated. The drop_out signal 472 is input to a second edge-based pulse generator 442 which generates a signal to reset the SR latch 455 and create the falling edge of the OUT signal 450. The timing of the rising and falling edges of output OUT signal 450 complies with the programmed duty cycle.

In each of the embodiment described herein, the output signal tracks changes in incoming frequency, and is independent of incoming duty cycle variations.

While the disclosure has been described in terms of specific embodiments, it is evident in view of the foregoing description that numerous alternatives, modifications and variations will be apparent to those skilled in the art. Various embodiments of the present disclosure can be employed either alone or in combination with any other embodiment, unless expressly stated otherwise or otherwise clearly incompatible among one another. Accordingly, the disclosure is intended to encompass all such alternatives, modifications and variations which fall within the scope and spirit of the disclosure and the following claims.

The invention claimed is:

1. A programmable duty cycle signal generator comprising:

a first integrator circuit for receiving an input clock signal (CLK); said first integrator circuit creating from said input CLK signal a first linear voltage signal representative of a full time period of said input CLK;

a digital to analog converter (DAC) receiving bits representing a programmed output signal duty cycle;

a sampling circuit generating a voltage supply signal from said first linear voltage signal for input to said DAC, said DAC using said voltage supply signal and said programmed bits to generate a reference signal voltage representative of the programmed duty cycle;

an edge pulse detector detecting an edge of said input CLK to create trigger signal and generating a rising edge of an output signal of the duty cycle signal generator;

a second integrator for integrating, in real time, said output signal to create a second linear voltage output signal;

a comparator device receiving said reference signal voltage and said second linear voltage output signal and generating a compared output signal at a time said second linear voltage output signal exceeds said reference signal, said compared output signal being used to generate a falling edge of said output signal, said output signal rising and falling edge occurring in each time period at said programmed duty cycle.

2. The programmable duty cycle signal generator as claimed in claim 1, further comprising:

a divider circuit for first receiving said input CLK and outputting a divider output signal having an ON time duration equal to its OFF time duration, wherein said divider output signal ON time duration corresponds to a single time period of the input CLK signal, said divider output signal being provided to said first integrator circuit, wherein said first integrator circuit converts said input CLK signal to increasing linear waveform signal having a minimum to maximum value representative of the full time period of CLK input.

3. The programmable duty cycle signal generator as claimed in claim 2, further comprising: first logic circuit for resetting said first integrator circuit responsive to or after receipt of an edge representing an end of said provided signal ON time duration and before an edge representing the beginning of a next ON time duration of said signal provided to said first integrator circuit.

4. The programmable duty cycle signal generator as claimed in claim 2, wherein the sampling circuit generating said voltage supply signal samples the first linear voltage signal at or near said maximum value and holds said sampled voltage value for input to the supply terminal of the said DAC.

5. The programmable duty cycle signal generator as claimed in claim 2, further comprising: a second logic circuit for resetting said second integrator circuit based on said generated falling edge of said programmable duty cycle output signal and a rising edge of said compared output signal.

6. The programmable duty cycle signal generator as claimed in claim 2, wherein said divider circuit output signal ON Time duration does not correspond to a single time period of the input CLK signal, said divider further simultaneously generates a complement signal of said divider circuit output signal, said complement signal representing an input CLK signal OFF time duration, said system further comprising:

a third integrator circuit for integrating said provided complement signal to create a third linear voltage signal, a further sampling circuit for generating a further voltage supply signal from said third linear voltage signal; and an averaging circuit for receiving both said voltage supply signal and said further voltage supply signal and generating an average direct current voltage of said voltage supply signal and said further voltage supply signal to represent said full time period, said averaged direct current voltage being input to the DAC for generating said reference signal voltage.

7. The programmable duty cycle signal generator as claimed in claim 2, further comprising:
a latch device being set responsive to receipt of a detected edge of said input CLK to generate a rising edge of an output signal of the duty cycle signal generator, said latch device further being reset to provide, based on receiving said compared output signal, said falling edge.

8. The method as claimed in claim 2, wherein the first integrator circuit has a linearly increasing rise time for the duration of said full time period.

9. A method for programmable duty cycle signal generation comprising:
receiving an input clock signal (CLK);
integrating, using a first integrator circuit, said input CLK signal to create a first linear voltage signal representative of a full time period of said input CLK, and in each period:
receiving at a digital to analog converter (DAC) bits representing a programmed output signal duty cycle;
generating a voltage supply signal from said first linear voltage signal for input to the DAC;
generating, by said DAC using said voltage supply signal and said duty cycle bits, a reference signal voltage representative of the programmed duty cycle;
detecting an edge of said input CLK signal to create a rising edge of an output signal of the duty cycle signal generator output;
integrating by a second integrator, in real time, said output signal to create a second linear voltage output signal;
comparing, in real-time, said reference signal to said second linear voltage output signal; and,
at a time said second linear voltage output signal exceeds said reference signal generating a compared output signal,
generating, based on said compared output signal, a falling edge of said output signal in the current period of said output signal, said rising and falling edge of said output signal of the duty cycle signal generator timed according to said programmed duty cycle.

10. The method as claimed in claim 9, further comprising:
receiving, at a divider circuit, the input CLK and outputting a divider output signal having an ON time duration equal to its OFF time duration, wherein said divider output signal ON time duration corresponds to a single time period of the input CLK signal, said divider output signal being provided to said first integrator circuit, wherein said input CLK signal is converted to a linear voltage signal of increasing ramp waveform signal having a minimum to maximum value representative of the full time period of CLK input.

11. The method as claimed in claim 10, further comprising: resetting said first integrator circuit responsive to or after receipt of an edge representing an end of said ON time duration and before an edge of a next ON time duration of said signal provided to said first integrator circuit.

12. The method as claimed in claim 10, wherein the generating said voltage supply signal comprises sampling the linear voltage signal at or near said maximum value, and provide said sampled signal as input to said DAC.

13. The method as claimed in claim 10, further comprising: resetting said second integrator circuit based on said generated falling edge of said programmable duty cycle output signal and a rising edge of said compared output signal.

14. The method as claimed in claim 10, wherein said divider circuit output signal ON Time duration does not correspond to a single time period of the input CLK signal, said method further comprising:
simultaneously generating a complement signal of said provided divider circuit output signal, said provided complement signal representing an input CLK signal OFF time duration;
integrating, using a third integrator circuit, said complement signal, to create a third linear voltage signal,
generating a further voltage supply signal from said third linear voltage signal; and
obtaining an average direct current voltage value of said voltage supply signal and said further voltage supply signal to represent said full time period, said averaged direct current voltage value being used as input to the DAC for generating said reference signal voltage.

15. The method as claimed in claim 10, further comprising:
setting, using said detected edge of said input CLK, a latch device to provide said rising edge of said programmable duty cycle output signal; and,
resetting said latch device, responsive to said compared output signal, at a time said second linear voltage output signal exceeds said reference signal.

16. A programmable duty cycle signal generator comprising:
a saw tooth conversion circuit for receiving an input clock signal (CLK) and creating from said input CLK signal a first linear increasing voltage signal representative of a full time period of said input CLK, and in each period:
a digital to analog converter (DAC) receiving bits representing a programmed output signal duty cycle;
a sampling circuit generating a voltage supply signal from said first linear increasing voltage signal for input to said DAC, said DAC using said voltage supply signal and said duty cycle bits to generate a reference signal voltage representative of a programmed duty cycle;
an edge pulse detector detecting an edge of said input CLK to create trigger signal and generating a rising edge of an output signal of the duty cycle signal generator;
a comparator device receiving said first linear increasing voltage signal and said reference signal voltage and for real-time comparing said first linear increasing voltage output signal to said reference signal, and, at a time said first linear increasing voltage output signal exceeds said reference signal, said comparator device generating a falling edge of said output signal in the current period of said output signal, wherein said rising and falling edges of said output signal of the duty cycle signal generator are timed according to said programmed duty cycle.

17. The programmable duty cycle signal generator as claimed in claim 16, wherein:
said saw tooth conversion circuit converts said input CLK signal to increasing linear waveform signal having a minimum to maximum value representative of the full time period of CLK input.

18. The programmable duty cycle signal generator as claimed in claim 17, wherein the sampling circuit generating the voltage supply signal samples the linear increasing voltage signal at or near said maximum value and holds said sampled voltage value for input to said DAC.

19. The programmable duty cycle signal generator as claimed in claim 18, wherein said sampling circuit generates an optional ground supply signal for input to said DAC when sampling and holding the linear voltage signal.

20. The programmable duty cycle signal generator as claimed in claim 18, further comprising:

a latch device being set responsive to receipt of a detected edge of said input CLK to generate a rising edge of an output signal of the duty cycle signal generator, said latch device further being reset to provide said falling edge responsive to said comparator device output.

21. A method for programmable duty cycle signal generation comprising:
   receiving an input clock signal (CLK);
   converting, using a saw tooth converter circuit, said input CLK signal to create a linear rising voltage signal representative of a full time period of said input CLK; and
   in each period:
   receiving at a digital to analog converter (DAC) bits representing a programmed output signal duty cycle;
   generating a voltage supply signal from said linear increasing voltage signal for input to the DAC;
   generating, by said DAC using said voltage supply signal and duty cycle bits, a reference signal voltage representative of a programmed duty cycle;
   detecting an edge of said input CLK to create trigger signal and generating a rising edge of an output signal of the duty cycle signal generator;
   comparing, in real-time, the reference signal voltage to the linear increasing voltage signal, and, at a time the linear rising voltage signal exceeds the reference signal voltage, generating a falling edge of said output signal in the current period of said output signal, said rising and falling edge of said output signal of the duty cycle signal generator timed according to said programmed duty cycle.

22. The method as claimed in claim 21, further comprising:
   receiving the input CLK at said first integrator, wherein said input CLK signal is converted to a linear increasing voltage signal of increasing ramp waveform signal having a minimum to maximum value representative of the full time period of CLK input.

23. The method as claimed in claim 22, wherein the generating said voltage supply signal comprises sampling the linear increasing voltage signal at or near said maximum value and holding said sampled voltage value for input to said DAC.

24. The method as claimed in claim 22, further comprising:
   setting, based on receipt of said detected edge of said input CLK, a latch device to provide said rising edge of said programmed duty cycle output signal; and,
   resetting said latch device at a time said linear voltage output signal exceeds said reference signal.

25. The method as claimed in claim 23, further comprising: generating an optional ground supply signal for input to said DAC when sampling and holding the linear voltage signal.

* * * * *